(12) United States Patent
Faue et al.

(10) Patent No.: US 6,285,216 B1
(45) Date of Patent: Sep. 4, 2001

(54) HIGH SPEED OUTPUT ENABLE PATH AND METHOD FOR AN INTEGRATED CIRCUIT DEVICE

(75) Inventors: Jon Allan Faue; Harold Brett Meadows, both of Colorado Springs, CO (US)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 09/213,764

(22) Filed: Dec. 17, 1998

(51) Int. Cl.[7] .............................................. H03K 19/096
(52) U.S. Cl. ............................. 326/95; 326/113; 326/98
(58) Field of Search ................................. 326/93–98, 113

(56) References Cited

U.S. PATENT DOCUMENTS 6,201,413 * 3/2001 Faue ........................................ 326/93

FOREIGN PATENT DOCUMENTS

06076592-A * 3/1994 (JP).

* cited by examiner

*Primary Examiner*—Michael Tokar
*Assistant Examiner*—Daniel D. Chang
(74) *Attorney, Agent, or Firm*—William J. Kubida; Hogan & Hartson LLP

(57) ABSTRACT

A high speed output enable path and method for an integrated circuit device which effectively minimizes the gate delays in the critical integrated circuit device data and clock paths and in which most amplification is added in the reset path which is not critical to access time. Based on an external clock, several "one-shot" internal output enable clocks are generated. These parallel output enable clocks have select information embedded in them to facilitate the multiplexing of several different data paths onto a single output buffer. This select information is implemented ir the reset portion of the one-shot circuit thereby removing it from the critical portion for determining access time.

28 Claims, 3 Drawing Sheets

HIGH SPEED OUTPUT ENABLE PATH AND METHOD FOR AN INTEGRATED CIRCUIT DEVICE

CROSS REFERENCE TO RELATED APPLICATIONS

The present invention is related to the subject matter disclosed in U.S. patent application Ser. No. 09/164,661 filed on Oct. 1, 1998 for "Synchronous Integrated Circuit Device Utilizing an Integrated Clock/Command Technique" assigned to United Memories, Inc., Colorado Springs, Colorado and Nippon Steel Semiconductor Corporation, Tateyama, Japan, assignees of the present invention, the disclosure of which is herein specifically incorporated by this reference.

BACKGROUND OF THE INVENTION

The present invention relates, in general, to the field of integrated circuit ("IC") devices. More particularly, the present invention relates to integrated circuit devices, for example, asynchronous and synchronous dynamic random access memory ("DRAM") devices, for which a fast data access is needed in conjunction with a pipelined data architecture.

Current integrated circuit devices tend to incorporate an excessive number of gate delays in their output data paths through the inclusion of a number of multiplexers deemed necessary to achieve acceptable levels of multiplexing. Moreover, such devices also tend to include extremely complicated anticipatory clock circuits implemented as phase locked loops ("PLLs"), delay locked loops ("DLLs"), time delay mirrors ("TDMs") and the like which must be implemented in order to achieve the overall desired device speed. Since most current integrated circuit devices do not provide for a minimum clock cycle, the on-chip area required to support such anticipatory clock circuits is prohibitively large. Still other devices attempt to speed up the output data path by "over-driving" the associated circuit nodes which is also done at the expense of device power and on-chip area constraints.

SUMMARY OF THE INVENTION

The technique disclosed herein is a particularly efficient device logic approach which effectively minimizes the gate delays in the critical integrated circuit device data and clock paths and most amplification is added in the reset path which is not critical to access time. The output clocking technique of the present invention, particularly when integrated with the clock/command technique disclosed in the aforementioned patent application, eliminates most of the critical race and/or data overlap conditions within an integrated circuit.

Based on an external clock, several "one-shot" internal output enable clocks are generated. These parallel output enable clocks have select information embedded in them to facilitate the multiplexing of several different data paths onto a single output buffer. This select information is implemented in the reset portion of the one-shot circuit thereby removing it from the critical portion for determining access time.

Stated another way, the present invention advantageously provides for a set of parallel output enable clocks, each of them implementing a "one-shot" clock embedded in the reset path of the output enable clocks, to provide the information necessary such that the next clock will also complete any data multiplexing functions that need to be executed. The duty cycle of the output enable clocks is matched to that of the other commands executing in the device to minimize race conditions and possible data overlap in the data path pipeline. The reset edge of the output enable clock is only derived from the buffered reset version of the main clock. Thus, the main clock only drives the active edge of the output enable clock. This significantly reduces the loading (or "fanout") on the main clock. In addition, the main clock is not distributed to all the device output buffers with only the derived output enable clocks being distributed.

Particularly disclosed herein is an output enable circuit for an integrated circuit device wherein the circuit comprises a clock buffer for receiving an external clock signal and producing an internal clock signal displaced from the external clock signal by a delay imposed by the clock buffer circuit. A reset circuit is coupled to the clock buffer circuit for producing a reset clock signal displaced from the internal clock signal by a delay imposed by the reset circuit. At least one output enable logic circuit is coupled to receive the internal and reset clock signals, the output enable logic circuit producing an output enable -clock signal having a first state thereof initiated on a first logic level transition of the internal clock signal and a second state thereof initiated on an opposite second logic level transition of the reset clock signal. At least one pass gate is coupled to receive the output enable clock signal and a data signal and is operative to provide the data signal to an output node when the output enable clock signal is in the first state thereof.

Further disclosed herein is a process for multiplexing data from multiple data sources to a common output node on an integrated circuit device. The process comprises: supplying an external clock signal to the integrated circuit device; buffering the external clock signal to provide an internal clock signal having n gate delays; delaying the internal clock signal to provide a reset clock signal having (n+an odd number) additional gate delays; producing at least one output enable clock signal having a first state thereof initiated on a first logic level transition of the internal clock signal and a second state thereof initiated on an opposite second logic level transition of the reset clock signal; and passing data corresponding to one of the data sources to the common output node in response to the output enable clock signal being in the first state thereof.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
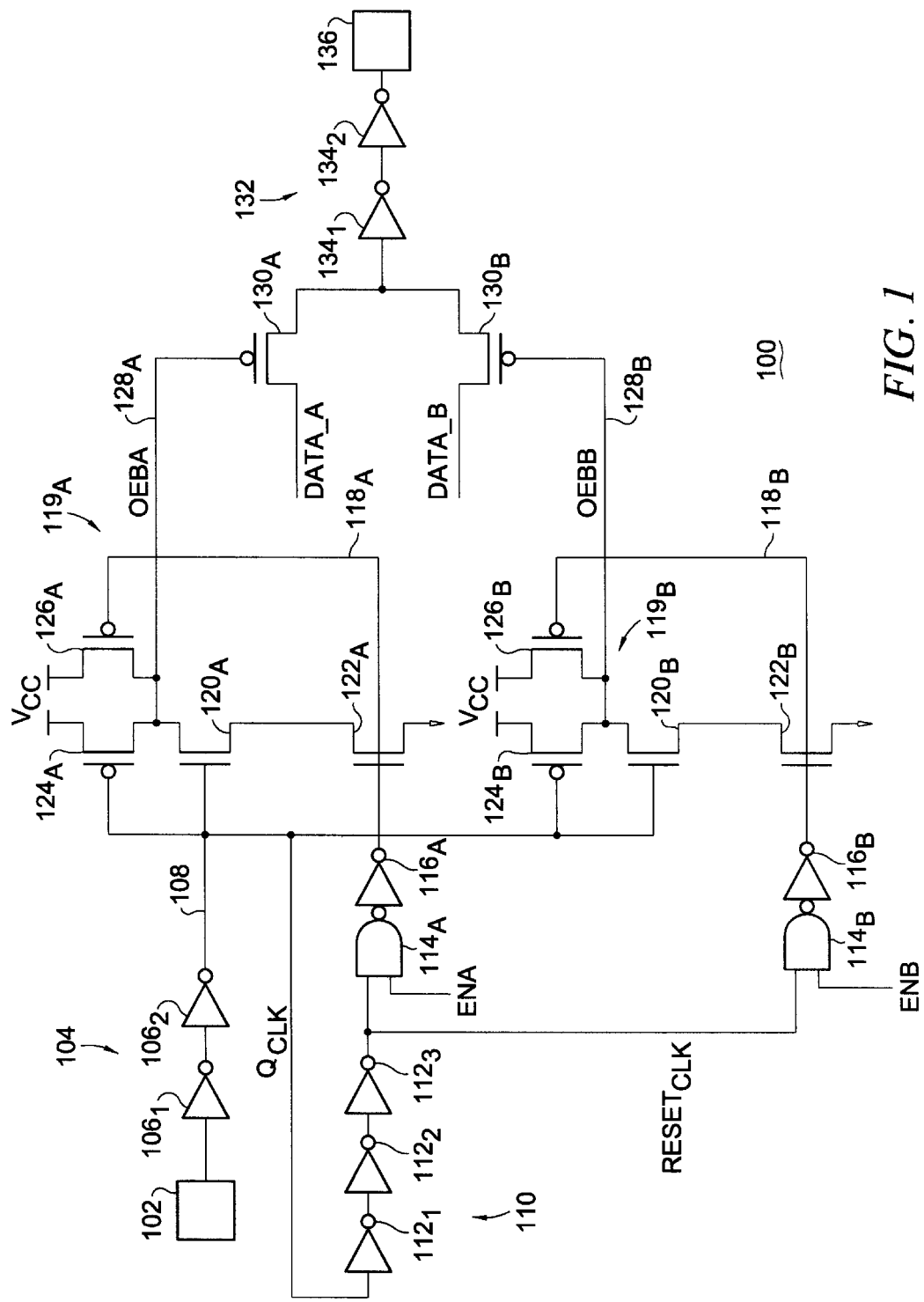
FIG. 1 is a simplified functional block/gate level schematic representation of a high speed output enable circuit in accordance with a particular embodiment of the present invention for use, for example, in an integrated circuit memory device.

With reference now to FIG. 1, a simplified functional block/gate level schematic representation of a high speed output enable circuit 100 in accordance with a particular embodiment of the present is shown. The circuit 100 is shown illustrating an external clock pad 102 and a minimal gate delay internal clock buffer 104 comprising only two inverting amplifiers $106_1$ and $106_2$. The output of the clock buffer 104 appears on clock node 108 and this internal clock signal ("$Q_{CLK}$") is not distributed to circuits throughout the integrated circuit device incorporating the circuit 100 as in prior techniques, such that only very few amplification stages are required with concomitantly less gate delay being introduced at this point.

The clock node 108 provides a non-inverted clock signal $Q_{CLK}$ to a reset circuit 110 comprising, in the embodiment illustrated, an odd number (i.e. three) inverting amplifiers $112_1$, $112_2$ and $112_3$. The clock buffer 104 and reset circuit 110 are configured to provide a reset clock signal ("$RESET_{CLK}$") as one input to a plurality of two-input NAND gates $114_A$ and $114_B$ which have their remaining input terminals coupled to receive an enable signal ("ENA" and "ENB") respectively. Output signals from the NAND gates $114_A$ and $114_B$ are inverted and amplified by means of inverting amplifiers $116_A$ and $116_B$ respectively for provision to nodes $118_A$ and $118_B$.

The clock node 108 and nodes $118_A$ and $118_B$ are supplied as inputs to a number of output enable logic circuits $119_A$, $119_B$ (effectively two-input NAND gates) comprising series coupled n-channel transistors $120_A$, $122_A$ and $120_B$, $122_B$ respectively, with the clock node 108 being coupled to the gate terminals of the n-channel transistors $120_A$ and $120_B$. The gate terminals of the n-channel transistors $122_A$ and $122_B$ are respectively coupled to the nodes $118_A$ and $118_B$ and have their source terminals coupled to circuit ground as shown. P-channel transistors $124_A$ and $124_B$ are also correspondingly coupled in series with the series coupled n-channel transistor pairs $120_A$, $122_A$ and $120_B$, $122_B$, having their source terminals coupled to a supply voltage source ("$V_{CC}$") and their gate terminals coupled to the clock node 108. An additional p-channel transistor $126_A$ and $126_B$ are coupled in parallel with the corresponding one of the p-channel transistors $124_A$ and $124_B$ and have their respective gate terminals coupled to the nodes $118_A$ and $118_B$. The node intermediate the transistors $124_A$, $120_A$ and transistors $124_B$, $120_B$ defines individual output enable clock bar A and B ("OEBA" and "OEBB") lines $128_A$ and $128_B$ which are supplied to the respective gate terminals of p-channel pass transistors $130_A$ and $130_B$. One terminal of each of the p-channel pass transistors $130_A$ and $130_B$ receives a DATA_A and DATA_B signal while their remaining terminals are common connected to the input of an output buffer 132 comprising but a pair of inverting amplifiers $134_1$ and $134_2$. The output buffer 132 is coupled to an output pad 136 as shown.

P-channel transistors $124_A$ and $124_B$ are laid out as very small devices that the signals OEBA and OEBB on lines $128_A$ and $128_B$ only reset through p-channel transistors $126_A$ and $126_B$ respectively and to ensure that p-channel transistors $124_A$ and $124_B$ present only a minimal load on clock node 108. Transistors $126_A$ and $126_B$ are made relatively large to accomplish the reset operation but five gate delays are available from $Q_{CLK}$ to increase the circuit drive. N-channel transistors $120_A$ and $120_B$ are also relatively large to enable a fast active edge low signal on lines $128_A$ and $128_B$. In turn, n-channel transistors $122_A$ and $122_B$ are made even larger, again to enable a fast active edge on lines $128_A$ and $128_B$, and to present as small a load on the clock node 108 as possible.

As will be seen, the DATA_A and DATA_B inputs to p-channel pass transistors $130_A$ and $130_B$ have the same number of gate delays to the output path, even if there were only a single path. Consequently, there is no gate delay penalty if multiple banks were added or for any other output configurations.

Figure 2:
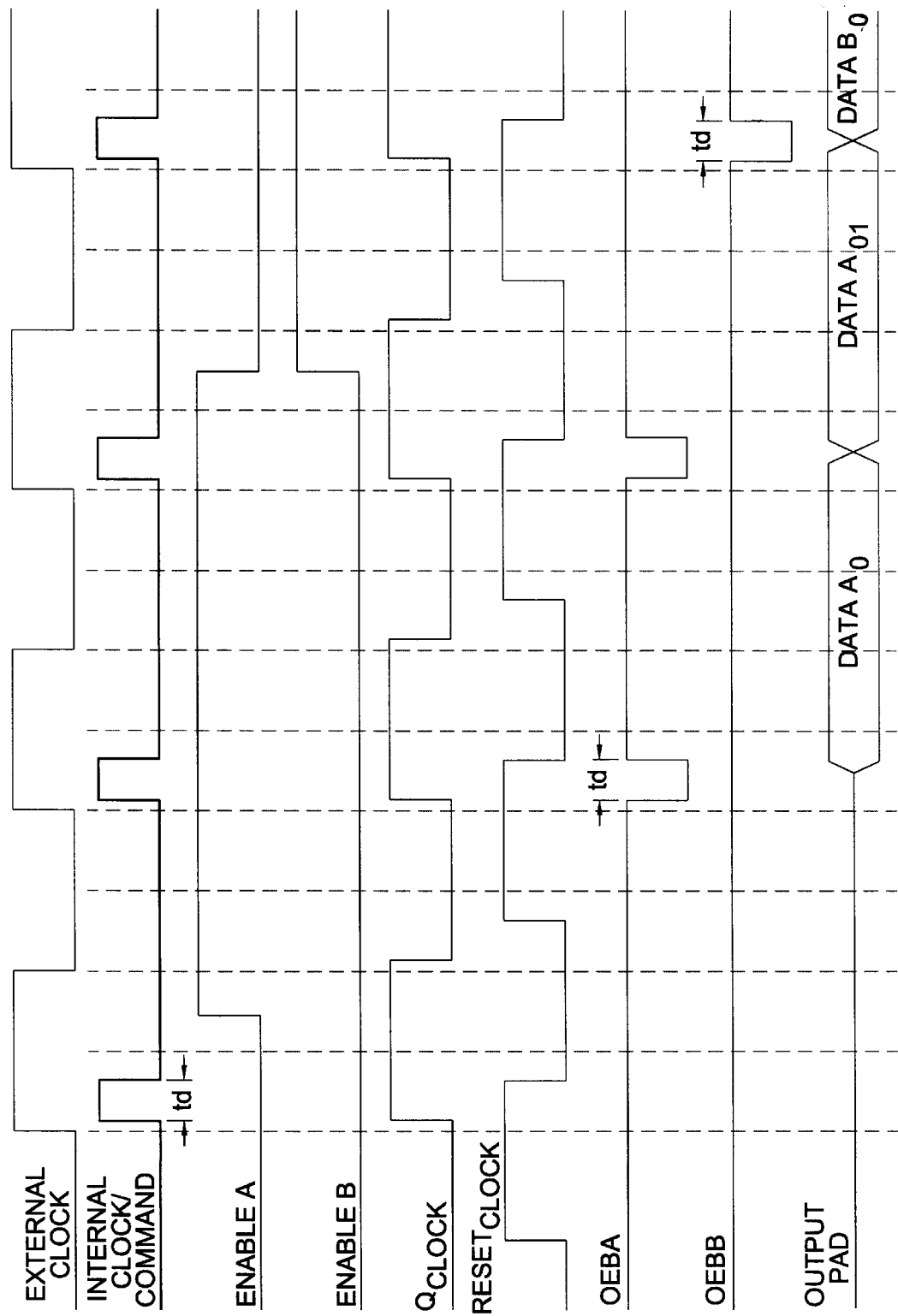
FIG. 2 is a corresponding timing diagram showing the signals at a number of the circuit nodes of the output enable circuit of FIG. 1 illustrating their interrelationship and relative timing.

With reference additionally now to FIG. 2, a corresponding timing diagram showing the signals at a number of the circuit nodes of the output enable circuit of FIG. 1 is shown illustrating their interrelationship and relative timing. The external clock signal shown in the first trace is an exemplary signal which may be applied to the clock pad 102 and, although illustrated as having a duty cycle of substantially 50%, an external clock signal having any particular pulse width and any given duty cycle would suffice.

The internal clock/command signal of the second trace is that which would appear on nodes $118_A$ and $118_B$ of the circuit in FIG. 1 and it is initiated on the rising edge of $Q_{CLK}$ (the buffered external clock of trace 5) on clock node 108 and terminated on the following falling edge of $RESET_{CLK}$ (trace 6) at the output of the reset circuit 110. The duration or pulse width of the internal clock/command signal ("$t_d$") is equal to the gate delay of the reset circuit 110 ("$t_r$") plus the gate delay attributable to NAND gate $114_A$, $114_B$ and inverting amplifier $116_A$, $116_B$ ("ts"). The value of td is fixed and independent of the duty cycle of the external clock. It is matched for all commands on the chip including the OEBA and OEBB signals.

The ENABLE A ("ENA") and ENABLE B ("ENB") signals of traces 3 and 4 are those signals applied to the inputs of the NAND gates $114_A$ and $114_B$ respectively and are generated off of the falling edge of the internal clock/command signal. The output enable clock bar A and B signals ("OEBA" and "OEBB")of traces 7 and 8 are signals which shift the data on the DATA_A and DATA_B lines respectively to the output pad 136. The data at the output pad 136 is shown in trace 9 and is shown to correspond to the alternate states of OEBA and OEBB respectively. In this manner and without adding gate delays to the data path, data from multiple sources (only two are shown in the exemplary circuit 100 of the present invention although more can be provided in accordance with the disclosure herein) can be multiplexed onto a single output pad and the effective gate delays are essentially "hidden" in the clock reset path.

Figure 3:
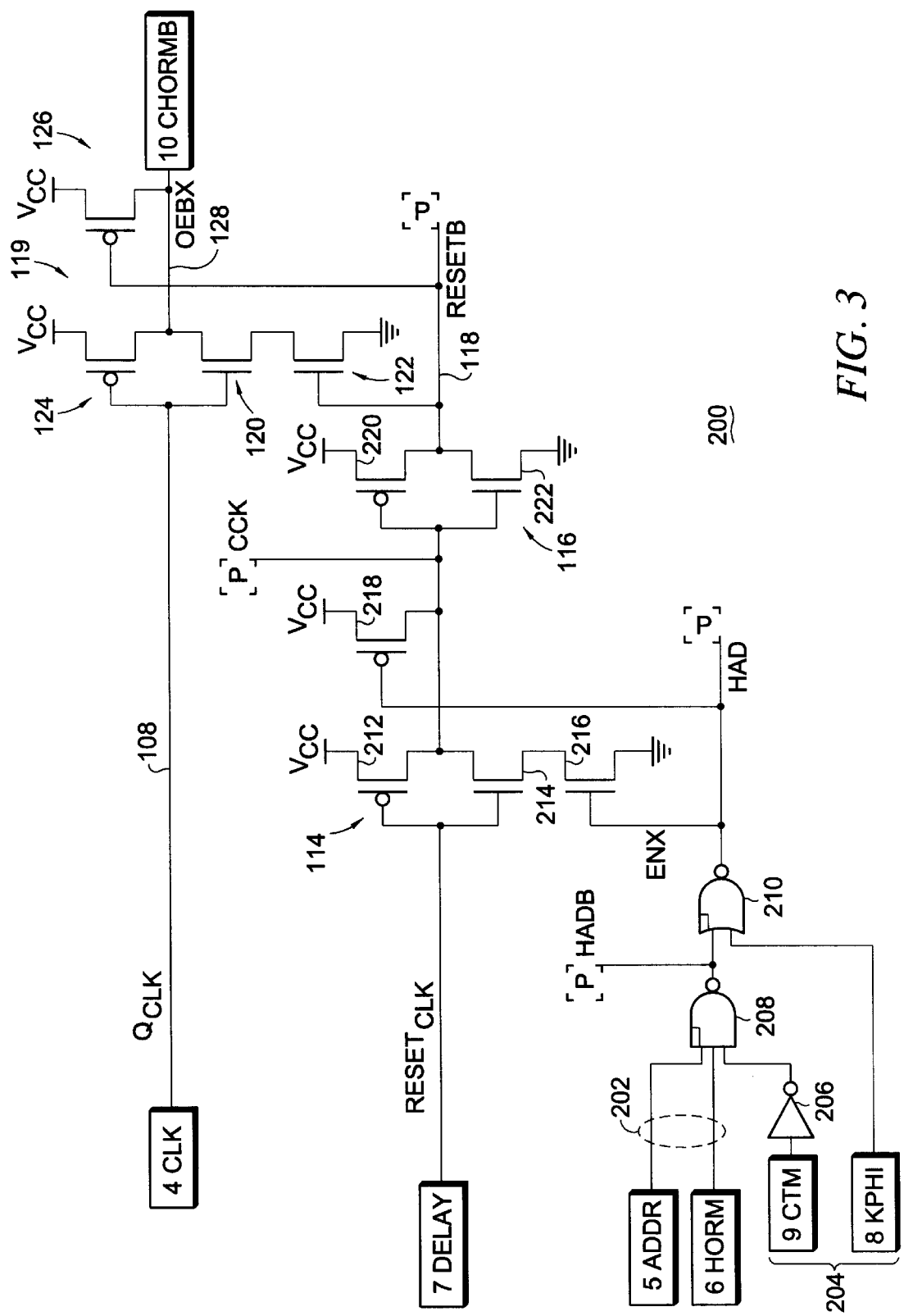
FIG. 3 is a more detailed functional block/gate level schematic illustration of a representative portion of a high speed output enable circuit in accordance with an actual implementation of the present invention for use, for example, in a synchronous DRAM.

With reference additionally now to FIG. 3, a more detailed functional block/gate level schematic illustration o: a representative portion of a high speed output enable circuit 200 in accordance with an actual implementation of the present invention is shown. With respect to the circuit 200, like structure to that previously described has been like numbered and the foregoing description thereof shall suffice herefor. In an actual implementation of an integrated circuit device, any desired number of the circuits 200 may be provided depending on the number of outputs desired to be multiplexed to a given output pad.

The circuit 200 includes a pair of data select lines 202 ("ADIDR" and "HORM") which must be valid to select the circuit 200. Another pair of disable inputs 204 are also provided, one of the inputs 204 is supplied through an inverter 206 to an input of a NAND gate 208 having the data select lines as other inputs thereto and another of the inputs 204 is supplied as one input to a NOR gate 210 having the output of the NAND gate 208 as its other input. The output of the NOR gate 210 provides the enable ("ENX") input to the NAND gate 114, wherein the "X" indicates that any number of circuits 200 may be provided.

The NAND gate 114 comprises series connected transistors 212, 214 and 216 together with pull-up transistor 218.

Transistor 212 is a p-channel device and the transistors 214 and 216 are n-channel devices. The width-to-length ratio ("W/L") of transistor 212 may be 12µ as compared to 24µ and 50µ for transistors 214 and 216 respectively. The pull-up transistor 218 is also illustrated having a W/L ratio of 24µ. The inverting amplifier 116 comprises a CMOS inverter wherein the p-channel transistor 220 has a W/L ratio of 40µ compared to 20µ for the n-channel transistor 222. The output enable logic circuit 119 utilized in this particular implementation of the circuit 200 shows that transistor 124 has a W/L ratio of 3µ, transistor 120 has a W/L ratio of 50µ, transistor 122 has a W/L ratio of 100µ as does transistor 126. As can be determined, transistor 124 is made relatively small, with transistor 120 being relatively larger and transistors 122 and 126 being largest of all. The output enable clock bar X ("OEBX") signal is taken at the output of the output enable logic circuit 119 as shown and corresponds to either of the OEBA or OEBB signals of the circuit 100 of FIG. 1. Again, the "X" designation means that any number of output enable clock bar signals may be provided in accordance with the number of circuits 200 implemented.

In a particular implementation of the circuit 200 in accordance with the present invention for use in a synchronous DRAM in which four memory banks are utilized in X4, X8 or X16 bond option configurations, for any given node there are eight possible data path inputs to each output buffer. Through use of the circuit 200, an 8:1 multiplexing may be achieved while adding no additional gates to the actual data path, although a single transfer gate may be required for pipeline functionality. Moreover, because the select logic is embedded in the clock reset path, the output enable clock remains still extremely fast with only three gate delays from the external clock pad 102 (FIG. 1) to the output enable clock line 128 with no anticipatory clock generation scheme required. Fanout/loading on the clock line may be minimized by separating the active and reset edges of the clock, with most loading on the reset edge which is then buffered.

While there have been described above the principles of the present invention in conjunction with a specific integrated circuit memory device implementation and CMOS processing technology it is to be clearly understood that the foregoing description is made only by way of example and not as a limitation to the scope of the invention which may be utilized in any other type of integrated circuit device utilizing any known processing technology. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An output enable circuit for an integrated circuit device, said circuit comprising:

a clock buffer for receiving an external clock signal and producing an internal clock signal displaced from said external clock signal by a delay imposed by said clock buffer circuit;

a reset circuit coupled to said clock buffer circuit for producing a reset clock signal displaced from said internal clock signal by a delay imposed by said reset circuit;

at least one output enable logic circuit coupled to receive said internal clock signal and said reset clock signal, said output enable logic circuit producing an output enable clock signal having a first state thereof initiated on a first logic level transition of said internal clock signal and a second state thereof initiated on an opposite second logic level transition of said reset clock signal; and at least one pass gate coupled to receive said output enable clock signal and a data signal, said pass gate operative to provide said data signal to an output node when said output enable clock signal is in said first state thereof.

2. The circuit of claim 1 further comprising a logic gate interposed between said reset circuit and said output enable logic circuit, said logic gate having an enable input thereof for providing said reset clock signal to said output enable logic circuit when said enable input is asserted.

3. The circuit of claim 2 wherein said logic gate comprises a NAND gate.

4. The circuit of claim 3 wherein said logic gate further comprises an inverting amplifier coupled in series with said NAND gate.

5. The circuit of claim 1 wherein said clock buffer comprises at least one amplifier stage.

6. The circuit of claim 5 wherein said clock buffer comprises no more than two amplifier stages.

7. The circuit of claim 1 wherein said reset circuit comprises an odd number of series coupled inverting amplifier stages.

8. The circuit of claim 7 wherein said reset circuit comprises no more than three inverting amplifier stages.

9. The circuit of claim 1 further comprising an output buffer coupling said output node to an output pad.

10. The circuit of claim 9 wherein said output buffer comprises at least one amplification stage.

11. The circuit of claim 10 wherein said output buffer comprises no more than two amplification stages.

12. The circuit of claim 1 wherein said at least one output enable logic circuit and said at least one pass gate comprise a plurality of said output enable logic circuits and associated pass gates receiving a like plurality of data signals.

13. The circuit of claim 12 wherein said plurality of associated pass gates are alternatively enablable by said plurality of said output enable logic circuits to alternatively provide said plurality of data signals to said output node.

14. The circuit of claim 1 wherein said at least one output enable circuit comprises a two-input NAND gate.

15. The circuit of claim 14 wherein said NAND gate comprises first, second, third and fourth transistors, said first, second and third transistors being coupled in series between a supply voltage source and circuit ground and said fourth transistor being coupled between said supply voltage source and an output enable node intermediate said first and second transistors, said first and second transistors having common connected control terminals thereof coupled to receive said internal clock signal and said third and fourth transistors having common connected control terminals thereof coupled to receive said reset clock signal, said output enable clock signal being provided at said output enable node.

16. The circuit of claim 15 wherein said first and fourth transistors are p-channel devices and said second and third transistors are n-channel devices.

17. The circuit of claim 15 wherein said first transistor is relatively small and said third and fourth transistors are relatively large compared to said second transistor.

18. The circuit of claim 1 wherein said internal clock signal and said reset clock signal have a given delay and said output enable clock signal has a duty cycle independent of said external clock signal.

19. The circuit of claim 1 wherein said integrated circuit device comprises a memory device.

20. The circuit of claim 19 wherein said memory device comprises a synchronous dynamic random access memory device.

21. A process for multiplexing data from multiple data sources to a common output node on an integrated circuit device, said process comprising:

supplying an external clock signal to said integrated circuit device;

buffering said external clock signal to provide an internal clock signal having n gate delays;

delaying said internal clock signal to provide a reset clock signal having an odd number of additional gate delays;

producing at least one output enable clock signal having a first state thereof initiated on a first logic level transition of said internal clock signal and a second state thereof initiated on an opposite second logic level transition of said reset clock signal; and passing data corresponding to one of said data sources to said common output node in response to said output enable clock signal being in said first state thereof.

22. The process of claim 21 wherein said step of buffering said external clock signal is carried out by means of a clock buffer having no more than two series coupled amplification stages.

23. The process of claim 21 wherein said step of delaying said internal clock signal is carried out by means of a reset circuit having an odd number of series coupled inverting amplification stages.

24. The process of claim 21 wherein said step of producing at least one output enable clock signal comprises the steps of:

alternatively producing plural output enable clock signals; and alternatively passing data from a plural number of said multiple data sources to said common output node in response to each of said plural output enable clock signals being respectively in said first state thereof.

25. The process of claim 21 wherein said step of producing is carried out by means of an output enable logic circuit.

26. The process of claim 21 wherein said step of passing is carried out by means of a pass transistor coupled to said common output node and coupled to receive said data from one of said multiple data sources and said output enable clock signal at a control terminal thereof.

27. The process of claim 21 further comprising the steps of:

amplifying a data signal on said common output node; and providing said amplified data signal to an external output pad of said integrated circuit device.

28. The process of claim 27 wherein said step of amplifying is carried out by an output buffer having no more than two series coupled amplification stages.

* * * * *

UNITED STATES PATENT AND TRADEMARK OFFICE
CERTIFICATE OF CORRECTION

PATENT NO. : 6,285,216 B1      Page 1 of 1
DATED : September 4, 2001
INVENTOR(S) : Jon Allan Faue and Harold Brett Meadows It is certified that error appears in the above-identified patent and that said Letters Patent is hereby corrected as shown below:

<u>Title page,</u>
ABSTRACT,
Line 10, "ir" should be -- in --.

Signed and Sealed this

Twelfth Day of March, 2002

*Attest:*

*Attesting Officer*

JAMES E. ROGAN
*Director of the United States Patent and Trademark Office*